US012785634B2

(12) United States Patent
Hill et al.

(10) Patent No.: US 12,785,634 B2
(45) Date of Patent: Nov. 3, 2026

(54) PASSIVE TUNABLE ON-CHIP LOAD MODULATION NETWORK FOR HIGH-EFFICIENCY POWER AMPLIFIERS

(71) Applicant: The Regents of the University of California, Oakland, CA (US)

(72) Inventors: Cameron Hill, Goleta, CA (US); James F. Buckwalter, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 642 days.

(21) Appl. No.: 18/306,412

(22) Filed: Apr. 25, 2023

(65) Prior Publication Data

US 2023/0353105 A1 Nov. 2, 2023

Related U.S. Application Data

(60) Provisional application No. 63/335,268, filed on Apr. 27, 2022.

(51) Int. Cl.

*H03F 3/191* (2006.01)
*H03F 1/56* (2006.01)
*H03F 3/213* (2006.01)
*H04B 1/04* (2006.01)

(52) U.S. Cl.

CPC ............. *H03F 3/213* (2013.01); *H03F 1/565* (2013.01); *H04B 1/0458* (2013.01); *H03F 2200/451* (2013.01)

(58) Field of Classification Search

CPC ........ H03F 3/191; H03F 3/193; H03F 3/1935; H03F 3/195

USPC .................................................. 330/302, 305

See application file for complete search history.

(56) References Cited

U.S. PATENT DOCUMENTS

| | | | | |
|---|---|---|---|---|
| 6,650,178 B1 * | 11/2003 | Brankovic | H04L 27/38 455/313 |
| 10,033,074 B2 * | 7/2018 | Coleman | H01P 1/062 |
| 11,750,156 B2 * | 9/2023 | Chan | H03F 3/195 330/295 |
| 2021/0013839 A1 * | 1/2021 | Wang | H03F 3/195 |

OTHER PUBLICATIONS

Andersson, et al., "A 1-3-GHz Digitally Controlled Dual-RF Input Power-Amplifier Design Based on a Doherty-Outphasing Continuum Analysis", IEEE Transactions on Microwave Theory and Techniques, 2013, vol. 61, No. 10, pp. 3743-3752.

(Continued)

*Primary Examiner* — Henry Choe

(74) *Attorney, Agent, or Firm* — Greer, Burns & Crain, Ltd.; Steven P. Fallon

(57) ABSTRACT

A passive, tunable on-chip load modulation network for a high-efficiency power amplifier includes a ring transmission line. An output is connected to a first point on the ring transmission line. A first switched input is connected to a second point on the ring transmission line, the second point being located on the ring transmission line to provide a first impedance transformation. A second switched input is connected to a third point on the ring transmission line, the third point being located to provide a second impedance transformation that is unique from the first impedance transformation.

14 Claims, 15 Drawing Sheets

(56) References Cited

OTHER PUBLICATIONS

Camarillo, et al., "Mechanics Modeling of Tendon-Driven Continuum Manipulators", IEEE Transactions on Robotics, 2008, vol. 24, No. 6, pp. 1262-1273.
Cinalli, Giuseppe, "Endoscopic Third Ventriculostomy", Pediatric Hydrocephalus, Chapter 25, 2005, pp. 1-29.
Dutta, et al., "Sub-100 nm2 Cobalt Interconnects", IEEE Electron Device Letters, 2018, vol. 39, No. 5, pp. 731-734.
Ernst, et al., "Initial Experience With Remote Catheter Ablation Using a Novel Magnetic Navigation System Magnetic Remote Catheter Ablation", Circulation, 2004, pp. 1472-1475.
Fu, et al., "Steerable catheters in minimally invasive vascular surgery", The International Journal of Medical Robotics and Computer Assisted Surgery, Int J Med Robotics Comput Assist Surg, 2009, 5: pp. 381-391.
Godoy, et al., "A 2.4-GHz, 27-dBm Asymmetric Multilevel Outphasing Power Amplifier in 65-nm CMOS", IEEE Journal of Solid-State Circuits, 2012, vol. 47, No. 10, pp. 2372-2384.
Heit, et al., "Sofia intermediate catheter and the SNAKE technique: safety and efficacy of the Sofia catheter without guidewire or microcatheter construct", J NeuroIntervent Surg, 2018, 10: pp. 401-405.
Hill, et al., "A 28-GHz Passive Outphasing Load Modulator in 40-nm GaN", IEEE/MTT-S International Microwave Symposium, 2021, pp. 610-613.
Hu, et al., "Future on-chip interconnect metallization and electromigration", IEEE International Reliability Physics Symposium (IRPS), 2018, p. 4F.1-1-4F.1-6.
Karnaty, et al., "Reconfigurable Millimeter-wave Power Amplifiers in GaN and SOI using Passive Load Modulation", IEEE/MTT-S International Microwave Symposium, 2022, pp. 990-993.
Kato, et al., "Tendon-Driven Continuum Robot for Endoscopic Surgery: Preclinical Development and Validation of a Tension Propagation Model", IEEE/ASME Transactions on Mechatronics, 2015, vol. 20, No. 5, pp. 2252-2263.
Khan, et al., "First experience with a novel robotic remote catheter system: Amigo™ mapping trial", J Interv Card Electrophysiol, 2013, 37: pp. 121-129.
Ning, et al., "A 30-GHz CMOS SOI Outphasing Power Amplifier With Current Mode Combining for High Backoff Efficiency and Constant Envelope Operation", IEEE Journal of Solid-State Circuits, 2020, vol. 55, No. 5, pp. 1411-1421.
Pasqui, et al., "Impact on Active Scope Deflection and Irrigation Flow of All Endoscopic Working Tools during Flexible Ureteroscopy", European Urology 45, 2004, pp. 58-64.
Probst, et al., "Load Modulation with an Adaptive Matching Network Based on MEMS for Efficiency Enhancement of an Inverse Class-F Power Amplifier", GeMiC, 2016, pp. 181-184.
Qi, et al., "Third-octave power amplifier using ring based matching network with high efficiency", Electronics Letters, 2016, vol. 52, No. 10, pp. 883-885.
Rabet, et al., "A 28 GHz Single-Input Linear Chireix (SILC) Power Amplifier in 130 nm SiGe Technology", IEEE Journal of Solid-State Circuits, 2020, vol. 55, No. 6, pp. 1482-1490.
Riga, et al., "Initial Clinical Application of a Robotically Steerable Catheter System in Endovascular Aneurysm Repair", J Endovasc Ther, 2009, 16: pp. 149-153.
Rostomyan, et al., "28 GHz Doherty Power Amplifier in CMOS SOI With 28% Back-Off PAE", IEEE Microwave and Wireless Components Letters, 2018, vol. 28, No. 5, pp. 446-448.
Sánchez-Pérez, et al., "Optimized Design of a Dual-Band Power Amplifier With SiC Varactor-Based Dynamic Load Modulation", IEEE Transactions on Microwave Theory and Techniques, 2015, vol. 63, No. 8, pp. 2579-2588.
Tant, et al., "A 2. 14GHz Watt-level Power Amplifier with Passive Load Modulation in a SOI CMOS technology", Proceedings of the ESSCIRC (ESSCIRC), 2013, pp. 189-192.
Watkins, Gavin T., "The Best of Both Worlds", IEEE Microwave Magazine, 2020, pp. 76-86.
Yoon, et al., "Large Grain Ruthenium for Alternative Interconnects", IEEE Electron Device Letters, 2019, vol. 40, No. 1, pp. 91-94.
Zaidi, et al., "Waveform and Numerology to Support 5G Services and Requirements", IEEE Communications Magazine, 2016, pp. 90-98.

* cited by examiner

PASSIVE TUNABLE ON-CHIP LOAD MODULATION NETWORK FOR HIGH-EFFICIENCY POWER AMPLIFIERS

PRIORITY CLAIM AND REFERENCE TO RELATED APPLICATION

The application claims priority under 35 U.S.C. § 119 and all applicable statutes and treaties from prior U.S. provisional application Ser. No. 63/335,268, which was filed Apr. 27, 2022.

FIELD

Fields of the invention include signal reception and receivers. The invention concerns a passive and tunable load modulation network for high-efficiency power amplifiers (PAs). The invention is applicable to high-efficiency power amplifiers used in wireless transceivers, including those used in 5G wireless networks. Additional applications include RF (radio frequency), microwave, and millimeter transmitters where load impedance controls the output power and efficiency delivered by a transistor.

BACKGROUND

Emerging 5G wireless networks achieve high data rates through the use of orthogonal frequency division multiplexing (OFDM) waveforms, which have high peak-to-average power ratios and require high PA efficiency at up to 10 dB back-off from the peak transmit power [1]. Load modulation improves backoff efficiency of PAs by exploiting the relationship between load impedance, efficiency, and output power. Often load modulation is accomplished by leveraging the interaction between two PAs as in Doherty and outphasing architectures [2-5]. However, these designs require multiple amplifiers and often utilize precise phase and amplitude control on the inputs, making them difficult to implement at millimeter-wave (mm-wave) frequencies. Sensitive combining networks between the two paths add additional challenges.

Alternatively, dynamic load modulation (DLM) uses switches to change the output tuning elements of the power amplifier to optimize efficiency for the desired output power [6]. Ideally, the DLM network would change the load impedance for according to an optimum value for peak power and another optimum value for a back-off power level. A heuristic for this is to consider the loadline of the transistor as directly determining the output power of the transistor. If the power is to be reduced, the current of the transistor would be reduce while the voltage swing is maintained to maximize the power efficiency of the transistor. Therefore, the loadline resistance must be increased at the backoff power level to improve efficiency. However, most approaches require a large bank of switched capacitors or varactors to change the load capacitance and therefore cannot access large areas of the Smith chart without significant loss [7], [8], [11], [13]. Scaling the DLM to mm-wave bands is also difficult due to the large parasitic capacitance and resistance associated with the switch or varactor components. Additionally, large banks of switches are generally only feasible in highly-scaled CMOS (complementary metal oxide semiconductor) processes, placing limits on the power handling for the network at the output of the PA.

REFERENCE LIST

[1] A. A. Zaidi et al., "Waveform and numerology to support 5G services and requirements," IEEE Comm Mag., vol. 54, no. 11, pp. 90-98, 2016.

[2] K. Ning et al., "A 30-GHz CMOS SOI outphasing power amplifier with current mode combining for high backoff efficiency and constant envelope operation," IEEE JSSC, vol. 55, no. 5, pp. 1411-1421, 2020.

[3] N. Rostomyan, M. Ozen, and P. Asbeck, "28 GHz Doherty power amplifier in CMOS SOI with 28% back-off PAE," IEEE MWCL, vol. 28, no. 5, pp. 446-448, 2018.

[4] Andersson et al., "A 1-3-GHz Digitally Controlled Dual-RF Input Power-Amplifier Design Based on a Doherty-Outphasing Continuum Analysis", TMTT 2013.

[5] Godoy et al. "A 2.4-GHz, 27-dBm Asymmetric Multi-level Outphasing Power Amplifier in 65-nm CMOS", JSSC 2012.

[6] G. T. Watkins, "The best of both worlds: The dynamic load-modulation power amplifier," IEEE Microw. Mag., vol. 21, no. 4, pp. 76-86, 2020.

[7] C. Sanchez-Perez et al., "Optimized design of a dual-band power amplifier with SiC varactor-based dynamic load modulation," IEEE TMTT, vol. 63, no. 8, pp. 2579-2588, 2015.

[8] G. Tant et al., "A 2.14 GHz watt-level power amplifier with passive load modulation in a SOI CMOS technology," in 2013 Proceedings of the ESSCIRC, 2013, pp. 189-192.

[9] B. Rabet and P. M. Asbeck, "A 28 GHz single-input linear chireix (SILC) power amplifier in 130 nm SiGe technology," IEEE JSSC, vol. 55, no. 6, pp. 1482-1490, 2020.

[10] T. Qi, S. He, and W. Shi, "Third-octave power amplifier using ring based matching network with high efficiency," Electronics Letters, vol. 52, no. 10, pp. 883-885, 2016.

[11] G. Tant, A. Giry, P. Vincent, J. Arnould and J. Fournier, "A 2.14 GHz watt-level power amplifier with passive load modulation in a SOI CMOS technology," 2013 Proceedings of the ESSCIRC (ESSCIRC), Bucharest, 2013, pp. 189-192.

[12] G. T. Watkins, "The Best of Both Worlds: The Dynamic Load-Modulation Power Amplifier," in IEEE Microwave Magazine, vol. 21, no. 4, pp. 76-86, April 2020.

[13] S. Probst, B. Lüers and B. Geck, "Load modulation with an adaptive matching network based on MEMS for efficiency enhancement of an inverse class-F power amplifier," 2016 German Microwave Conference (GeMiC), Bochum, 2016, pp. 181-184.

SUMMARY OF THE INVENTION

A preferred embodiment provides a passive, tunable on-chip load modulation network for a high-efficiency power amplifier and includes a ring transmission line. An output is connected to a first point on the ring transmission line. A first switched input is connected to a second point on the ring transmission line, the second point being located on the ring transmission line to provide a first impedance transformation. A second switched input is connected to a third point on the ring transmission line, the third point being located to provide a second impedance transformation that is unique from the first impedance transformation.

BRIEF DESCRIPTION OF DRAWINGS

FIG. 8A shows variation in $\Sigma\theta$ plotted as separate trajectories where the $\Delta\theta$ is swept from 0 to 90 degrees and $Z_1=Z_2=100$ Ohms; FIG. 8B shows trajectories plotted under an asymmetric choice for characteristic impedance;

DETAILED DESCRIPTION OF THE PREFERRED EMBODIMENTS

Figure 1A:
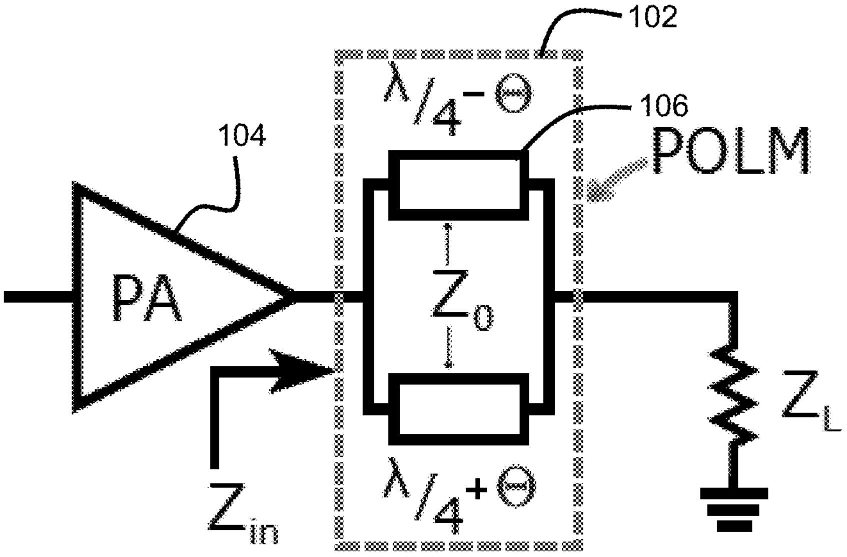
FIGS. 1A and 1B show (A) a schematic diagram of a preferred passive, tunable on-chip load modulation (POLM) network for a high-efficiency power amplifier and (B) input impedance vs. variation in transmission line length.

A preferred embodiment is a passive, tunable on-chip load modulation network for a high-efficiency power amplifier. The network includes a ring transmission line. An output is connected to a first point on the ring transmission line. A plurality of switched inputs is connected to a plurality of points on the ring transmission line. Each of the plurality of points provides a unique impedance based upon a distance from the first point in one direction around the ring transmission line compared to a distance from the first point in the other direction around the ring transmission line.

A preferred embodiment is a passive, tunable on-chip load modulation network for a high-efficiency power amplifier. The network includes a ring transmission line. An output is connected to a first point on the ring transmission line. A first switched input is connected to a second point on the ring transmission line, the second point being located a symmetrical distance to the first point in both directions around the ring transmission line. A second switched input is connected to a third point on the ring transmission line, the third point being located an asymmetrical distance to the first point in one direction around the ring transmission line compared to the other direction around the ring transmission line. The network can include a third switched input connected to a fourth point on the ring transmission line, the fourth point being located an asymmetrical distance to the first point in one direction around the ring transmission line compared to the other direction around the ring transmission line. Additional switched input points can be added. The balance to consider is a trade-off between the number of selectable impedances and switching insertion losses associated with each additional switched input.

Preferred embodiments provide the best of both outphasing and DLM. An example experimental passive outphasing load modulator (POLM) from 28 GHz was fabricated in a 40 nm GaN process that allows the load impedance to be tuned between 20 and 80 ohms with minimal imaginary load variation. The network switches across a transmission line ring where only one switch is required for each state, enabling low loss and allows for practical device layout at high frequency. The GaN process also allows for high linearity and power handling to provide minimal distortion in transmitting. Another example suitable material system for embodiments of the invention is a CMOS silicon on insulator material system.

Preferred embodiments provide a passive tunable matching network including a tunable ring transmission line that provides selectable real impedance transformations to optimize the loadline match of the PA for output power and/or efficiency. High-power switches can be used to enable post-PA power handling and linearity. An example prototype provides selectable impedances of 15, 50, or 80Ω in three switching states that had switch insertion losses between 1.7 and 3.3 dB and P1dB exceeding 33 dBm at a center frequency of 28 GHz. The example network was wideband, providing a bandwidth exceeding 2.5 GHz.

Figure 1B:
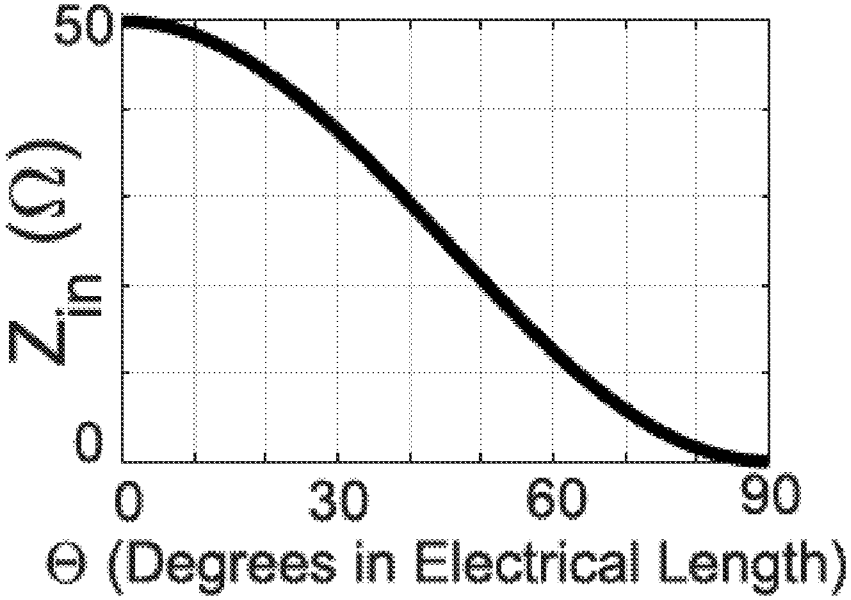

A preferred POLM network 102 is schematically represented in FIGS. 1A and 1B between a power amplifier 104 and its load $Z_L$. The network 102 is formed by a transmission line loop 106 of characteristic impedance, $Z_0$ and total circumference of λ/2 and serves as a matching network. If the length of each segment of the loop is adjusted by ±Θ relative to λ/4, then the input impedance can calculated be from:

$$Z_{in} = \frac{Z_0^2(\cos(\theta)+1)^2}{16 Z_L \cos^2(\theta)} \tag{1}$$

and is plotted in FIG. 1B for the case of $Z_0$=10052 and $Z_L$=50Ω. Eq. 1 demonstrates that ideal load modulation is possible, i.e., only a real impedance from zero to $$Z_0^2/(4Z_L)$$

is presented to the PA.

Figure 2A:
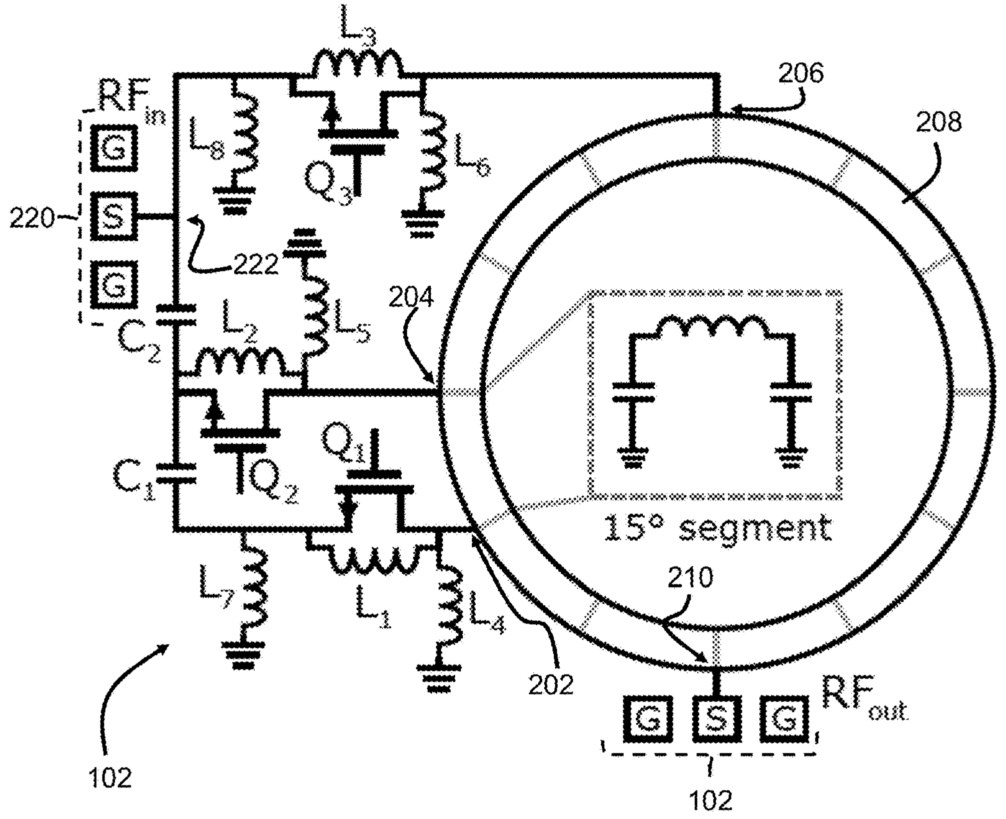
FIG. 2A is a circuit schematic of a preferred passive, tunable on-chip load modulation network for a high-efficiency power amplifier.

FIG. 2A shows a preferred POLM network 102 with three passively switched input points 202, 204 and 206 on a ring network 208 that can be selectively connected to modulate an output signal that is provided at an output point 210 by a switching network including transistors $Q_1$-$Q_3$, inductors $L_1$-$L_8$ and capacitors $C_1$ and $C_2$. A Ground-Signal-Ground (GSG) connection 220 controls the impedance at an input port 222 and a GSG terminal 224 controls the impedance at the output port 210. transistors $Q_1$-$Q_3$ are considered passive because they do not consume power under normal operation, having a drain to source voltage of zero ($V_{ds}$=0). The transistors $Q_1$-$Q_3$ can be separately controlled by external signals to change the switches, which signals can be based upon sensing average power over a period of time.

Figure 2B:
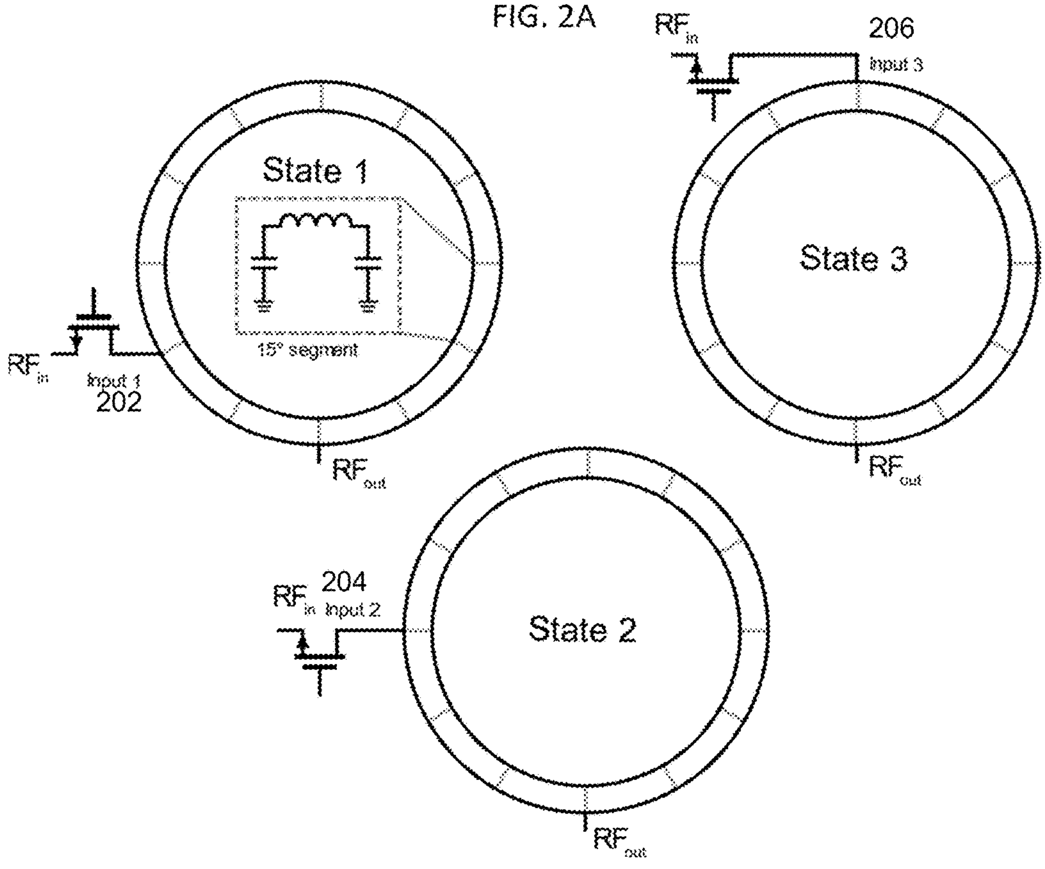
FIG. 2B schematically represents switching states of the network.

FIG. 2B illustrates three switching states of the network of FIG. 2A. As used herein, "ring" defines a 360-degree path, which need not be round. Constructing a network with continuously tunable transmission line lengths is a design challenge. One preferred solution is the transmission ring layout shown in FIG. 3, where the ring includes a plurality of bulb shaped portions 302 and straight valley portions 304, which allow a total length of 360 degrees around the transmission line loop or one electrical wavelength of the desired frequency of operation, where the width of the signal conductor is typically on the order of microns and is determined by characteristics of the planar metal stack according to the desired characteristic impedance, $Z_0$, which is typically 50-Ohms. The choice of the characteristic impedance may be adjusted to realize an impedance translation. The three switched input connection points 202, 204 and 206 are on the left side and the output point 210 is in the lower right corner of the transmission ring 208. The switched network accesses different points in the loop 208 to adjust the impedance seen by the PA, all with passive components integrated on chip.

Preferred transmission line rings may be realized as transmission lines or lumped-element based transmission lines according to the electromagnetic implementation that offers the lower loss. Lumped elements (capacitors/inductors) are provided in the thickest metals possible in the integrated circuit process for high quality factor and lowest loss. Additionally, switches can be constructed from the transistors in such way that the transistor gate is presented with an impedance to minimize losses in the switches.

Because the maximum real input impedance is bounded by $$Z_0^2/(4Z_L)),$$

it is desirable for $Z_0$ to be as large as possible to allow for a large input impedance variation. In order to increase the possible range of $Z_{in}$, artificial transmission lines are used, where the shunt capacitance is distributed, but a stripline coil is used to increase inductance per unit length. By doing this, $Z_0$ can be raised to 100Ω to produce a suitable impedance tuning range and each loop of the artificial transmission line produces a phase shift of 15 degrees at 28 GHz.

TABLE 1

| Comp. | $L_1$ | $L_2$ | $L_3$ | $L_4$ | $L_5$ | $L_6$ | $L_7$ | $L_8$ |
|---|---|---|---|---|---|---|---|---|
| Val.(pH) | 280 | 1000 | 730 | 300 | 300 | 350 | 260 | 320 |

Switches $Q_2$ and $Q_3$ are 300 um wide devices for states 2 and 3 while $Q_1$ is a 600 um device for state 1 since the input impedance seen when $Q_1$ is on is significantly lower. To eliminate feed through and improve the isolation of each switch, resonating inductors $L_1$, $L_2$ and $L_3$ are added to their respective switches. Adding the devices to the loop adds significant capacitive loading at each location and inductors $L_4$, $L_5$, and $L_6$ are used to combat this. The values of the inductors are given in Table 1 above. While these inductors prevent undesired loading of the loop, they also limit the bandwidth of the network, especially in state 3 which would normally have the widest bandwidth but is also most sensitive to shunt parasitics.

A combination of switch losses and parasitics on the input lines could cause the impedance at the input to drift above the simulated values of 12, 26, and 48Ω each of the loop inputs. Adding $L_8$ allows the input parasitic of $Q_3$ to be minimized while the combination of $C_1$ and $C_2$ cancels the inductance associated with the length of the input network to create a close to ideal simulated impedance of 15Ω. As a result, additional impedance separation is created between the three states, and utilizing $C_2$ and $L_7$ moves the impedance seen for states 2 and 3 to 45 and 75Ω respectively.

In sum, the capacitances and inductances provide switch tuning to limit performance degradation associated with loading of the ring. $L_1$, $L_2$ and $L_3$ resonate $C_{ds}$ (drain-source capacitance of the transistor). This essentially is the capacitance between the input and output of the switch). $L_4$, $L_5$ and $L_6$ resonate shunt Cout of each device. $L_7$, $L_8$, $C_1$ and $C_2$ help with input matching. $Q_1$ and $Q_2$ are 300 μm devices. $Q_3$ is 600 μm device to account for lower impedance seen at that port of the ring.

Experimental Results

Figure 3:
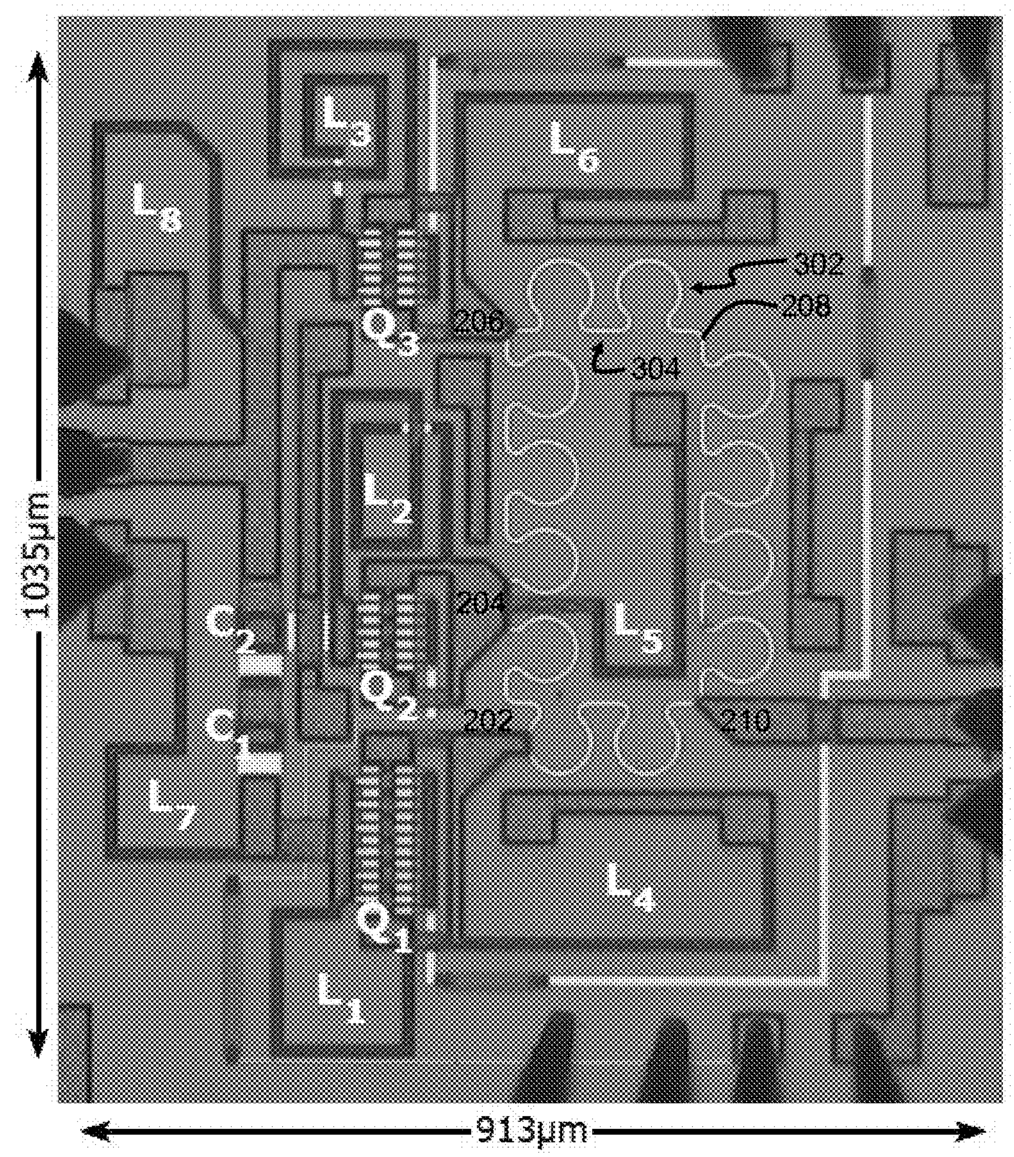
FIG. 3 is a photo of a chip of an experimental passive, tunable on-chip load modulation network fabricated in 40 nm GaN with components labelled to match the labelling in FIG. 2.
Figure 4:
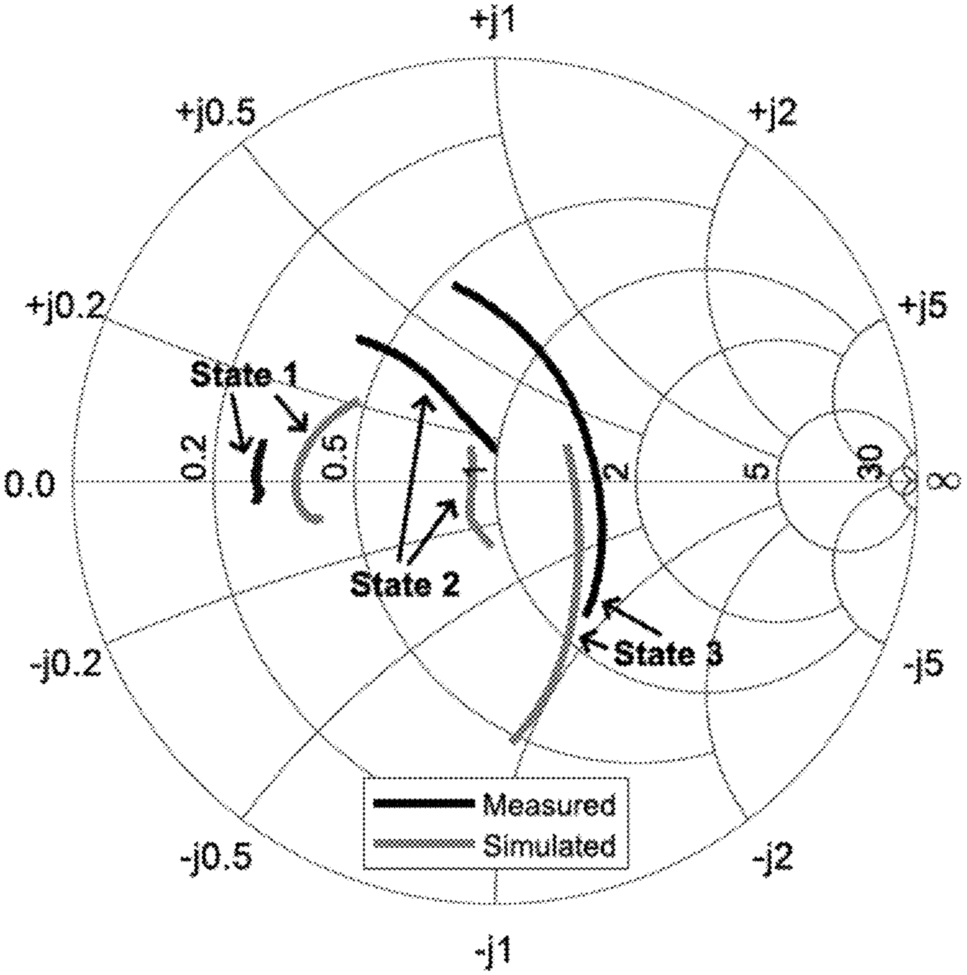
FIG. 4 is a Smith chart of measured versus simulated S11 for the three states of the network of the experimental modulation network.

The S-parameters were measured using a 67-GHz vector network analyzer and the input and output pads were de-embedded using on-chip SOLT calibration elements. The probing setup is shown in FIG. 3. A comparison of the measured and simulated $Z_{in}$ is shown in 4 for states 1, 2 and 3. The measured values for $Z_{in}$ are 13.5, 40, and 80Ω.

Figure 5A:
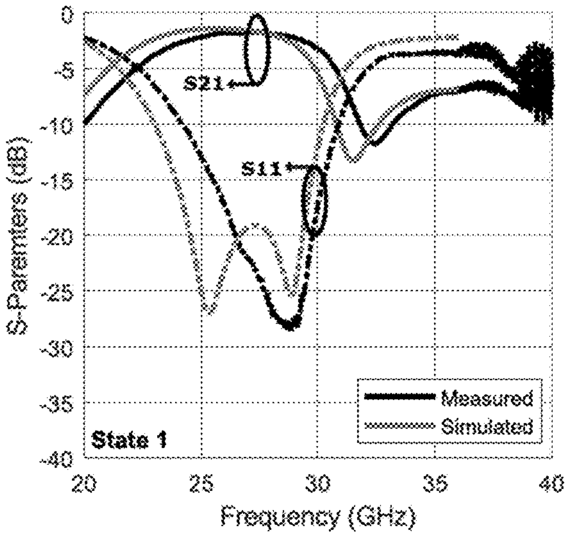
FIGS. 5A-5C are plots of the magnitude of measured and simulated S21 and S11 for switching states 1-3.
Figure 5B:
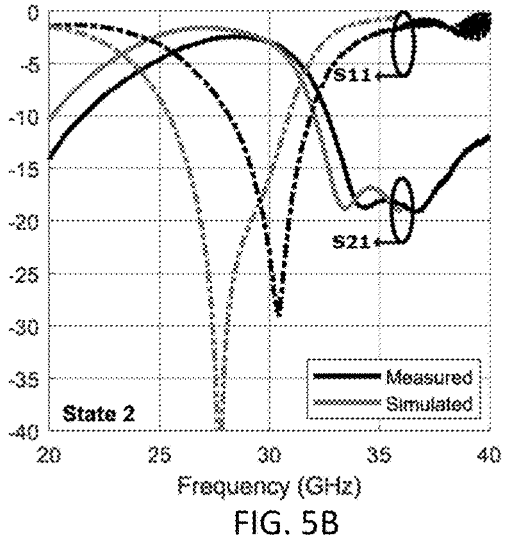
Figure 5C:
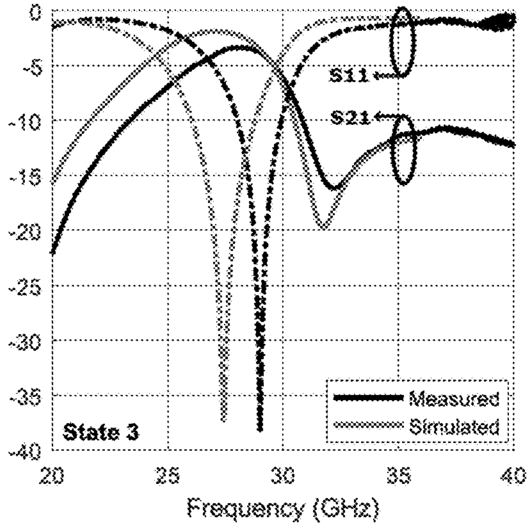

The mismatch between the simulated and measured parameters is a result of modeling errors leading to the resonant networks being tuned closer to 29-GHz while the loop network is tuned to 28-GHz. This shift in the center frequency can be seen in the log-scale measurements shown in FIGS. 5A-5C. This discrepancy leads to slightly more insertion loss (IL) than simulated. The measured IL is 1.7, 2.4, and 3.3 dB for each of the three load states, compared to simulated losses of 1.4, 1.6, and 1.9 dB in states 1, 2 and 3, respectively. In the limiting state 3, the 1 dB Bandwidth extends from 26.7-29.4 GHz.

Figure 6:
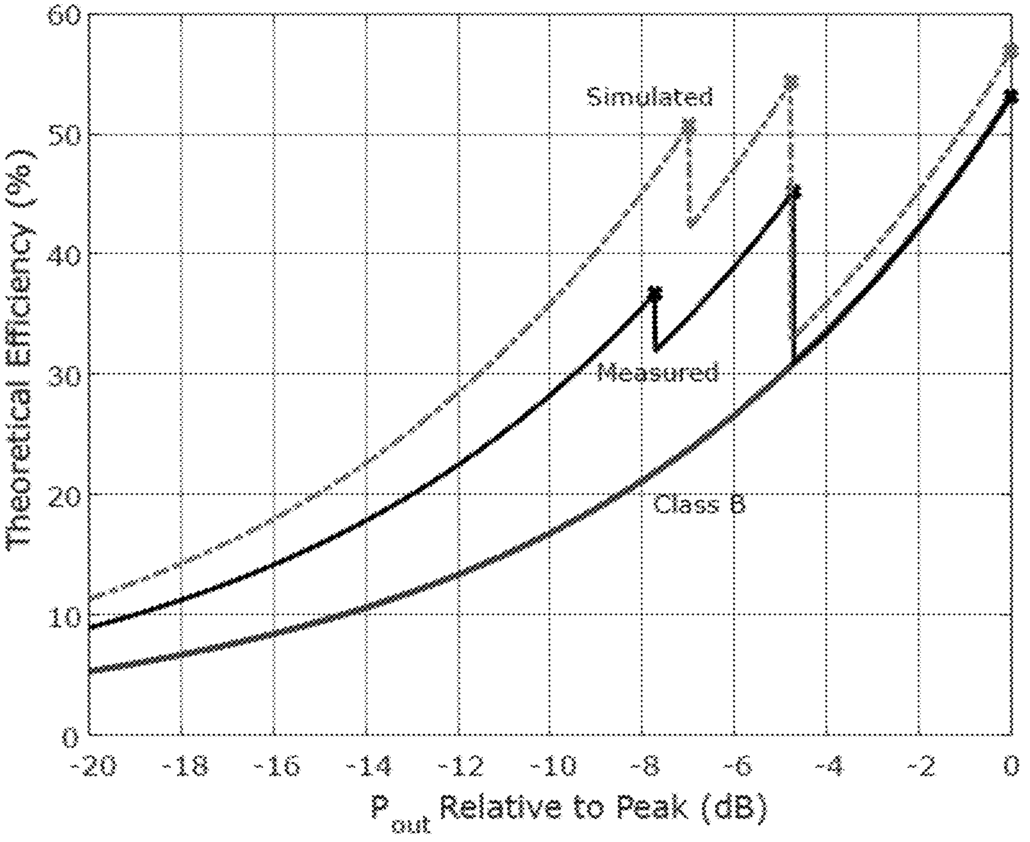
FIG. 6 is a plot of estimated efficiency improvement for measured versus simulated load modulation networks compared to ideal class B back-off efficiency.

The measured ratio of the lowest to highest real impedance presented by the network corresponds to a back-off power of 7.7 dB. In the worst case of state 3 the losses correspond to a theoretical back-off efficiency of 37% compared to just 22% for an ideal class B—a comparison that is plotted in FIG. 6.

Figure 7:
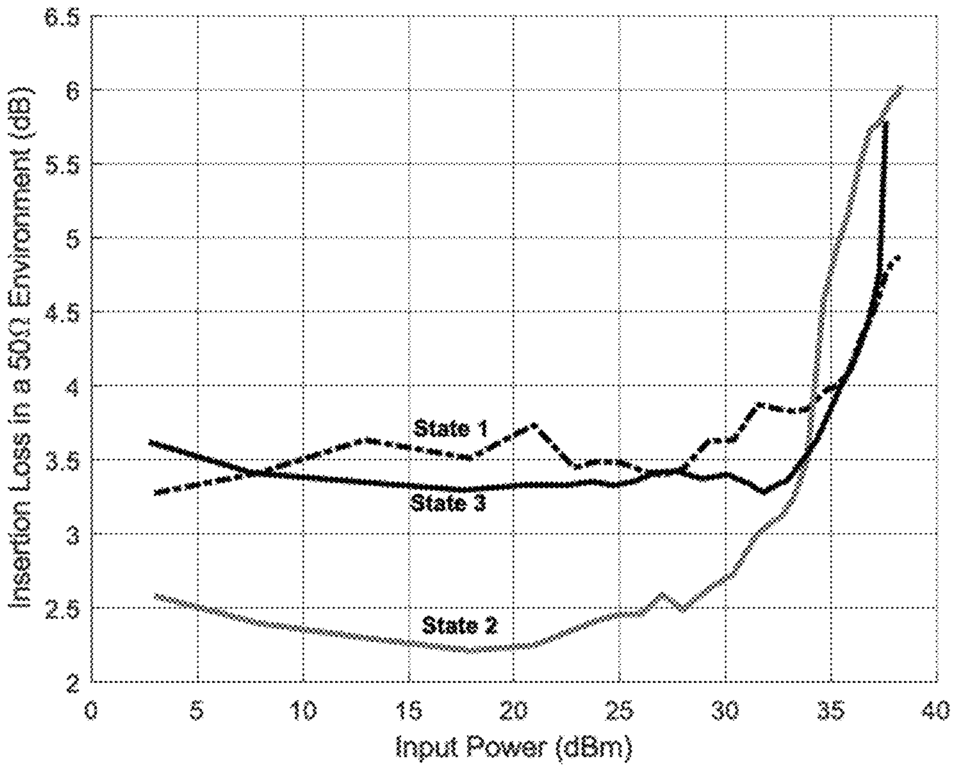
FIG. 7 is a plot of insertion loss versus input power for switching states 1-3 measured in a 50-ohm probe environment; insertion loss appears high because some power is reflected in switching states 1 and 3, which is accounted for in the x-axis.

For a post-PA network, the linearity in each state is important. To measure linearity, a Norsat block up-converter with a saturated power of 44 dBm was used to drive the test-bench. The input power was measured with a 20 dB coupler and Keysight N1913A power meter while the output was measured on a 67 GHz network analyzer. To account for calibration mismatch between source and receiver, the data was smoothed and the loss was normalized to match the low power S-parameters measured previously in a 50Ω environment. After de-embedding cable and probe losses, the insertion loss versus the input power to the network is presented in FIG. 7 with a limiting P1dB of 33 dBm in state 2. The maximum IIP3 measurable on this testbench was 36 dBm of which the linearity of the POLM exceeded.

The experiments demonstrated improved efficiency of power amplifiers at 28 GHz designed in a 40 nm GaN process. The present switched ring structure allows the impedance to be tuned between 15 and 80Ω and exhibits a maximum loss of 3.3 dB which is sufficient to offset back-off efficiency degradation in traditional amplifiers. Power handling of the network is greater than two watts due to the high breakdown voltage of the GaN devices.

The passive network 102 can be described as a pair of transmission lines with characteristic impedance $Z_1$ and $Z_2$, and a differential phase length relative to the total phase around the loop. Specifically, the differential phase is $2\Delta=\theta_1\theta_2$ and the loop phase is $2\Sigma=\theta_1+\theta_2$ where $\theta_2$ is the differential phase.

Figure 8A:
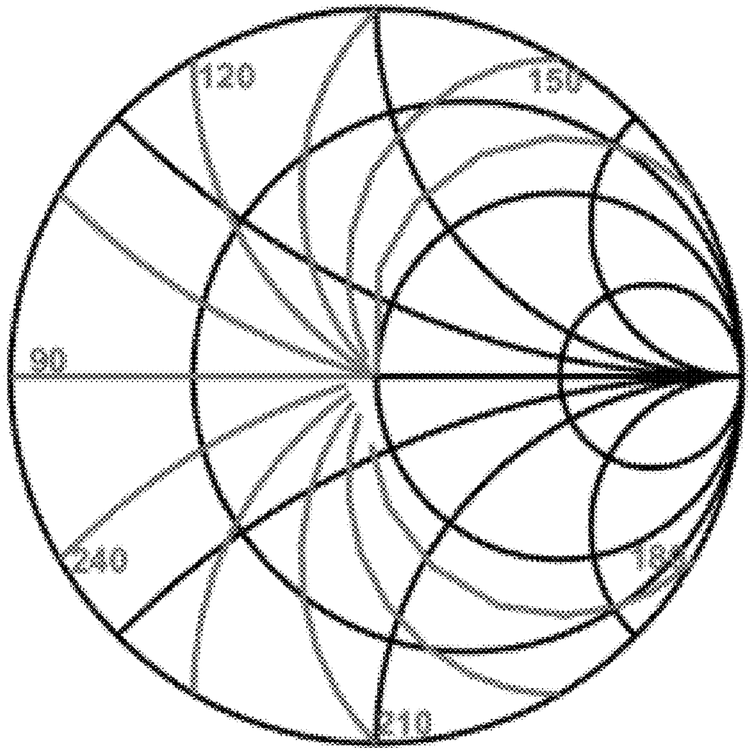
FIGS. 8A and 8B Load impedance variation for a POLM according to the invention.
Figure 8B:
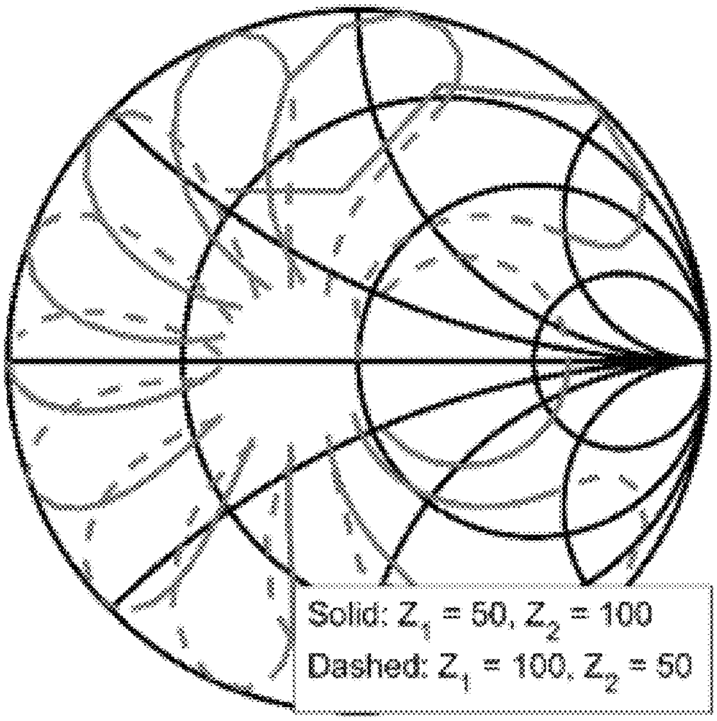

Under the condition that the characteristic impedance of the two arcs are $Z_1=Z_2=Z_0$, the input impedance is:

$$Z_{in} = \frac{R_L\cos^2\Delta}{\cos^2\Sigma + \frac{4R^2}{Z_0^2}\sin^2\Sigma} + j\frac{Z_0}{2}\cot\Sigma\left[\frac{\cos^2\Delta}{\cos^2\Sigma + \frac{4R^2}{Z_0^2}\sin^2\Sigma} - 1\right] \quad (2)$$

the resulting input impedance is plotted in FIGS. 8A and 8B for different choices of Σ and Δ. First, we consider the input impedance resulting when the characteristic impedance of both arms is equal to 100Ω. The choice of Σ ranges from 90° to 270° in 15° increments FIG. 8A and each curve corresponds to varying Δ from 0° to 90°. For the choice of Σ=90°, the input impedance changes along the real axis at ranges from 50Ω when Δ=0° to 0Ω when Δ=90°.

In FIG. 8B, the input impedance sweep is performed under the asymmetric condition on $Z_1$ and $Z_2$ as labelled. Notably, the asymmetric choice of characteristic impedance bends the impedance as a function of A curves relative to the symmetric solution in FIGS. 8A and 8B.

A technology-specific POLM implementation would fix the total loop phase (Σ) but would allow the differential phase to be varied (Δ). In theory, this would require a switch network to tap different locations around the loop.

Figure 9A:
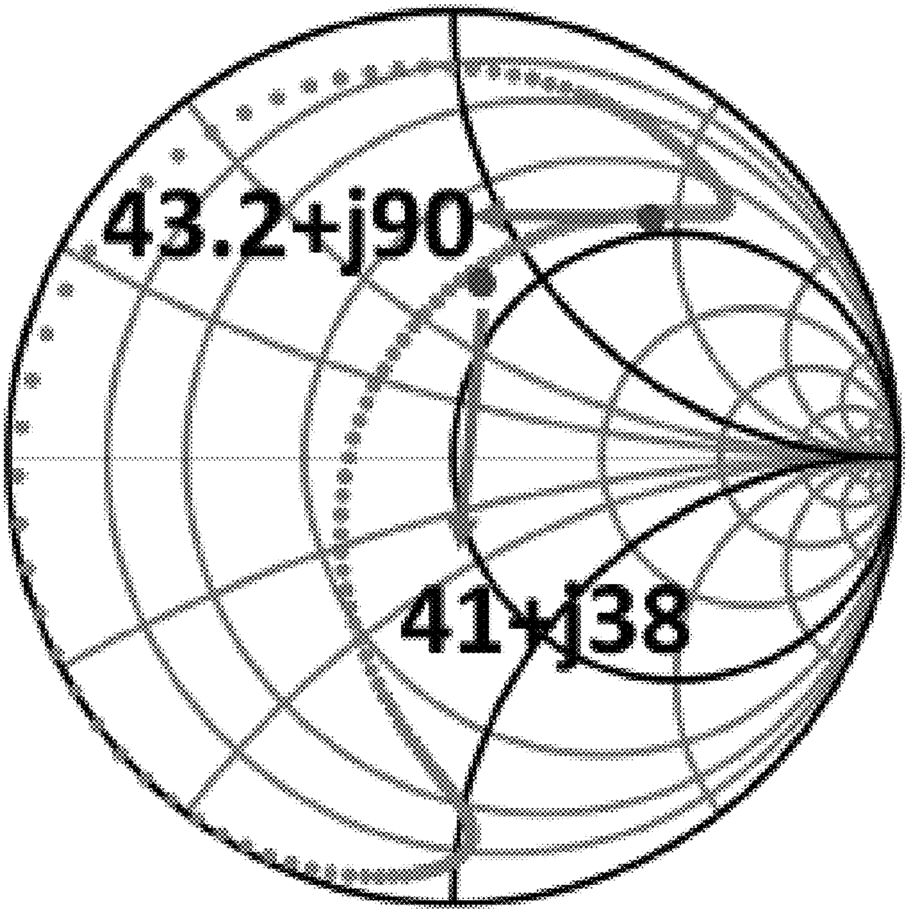
FIGS. 9A and 9B are a Smith Chart and plot of Load modulation for a CMOS SOI 4-stack differential PA illustrating the change in load impedance for high efficiency.
Figure 9B:
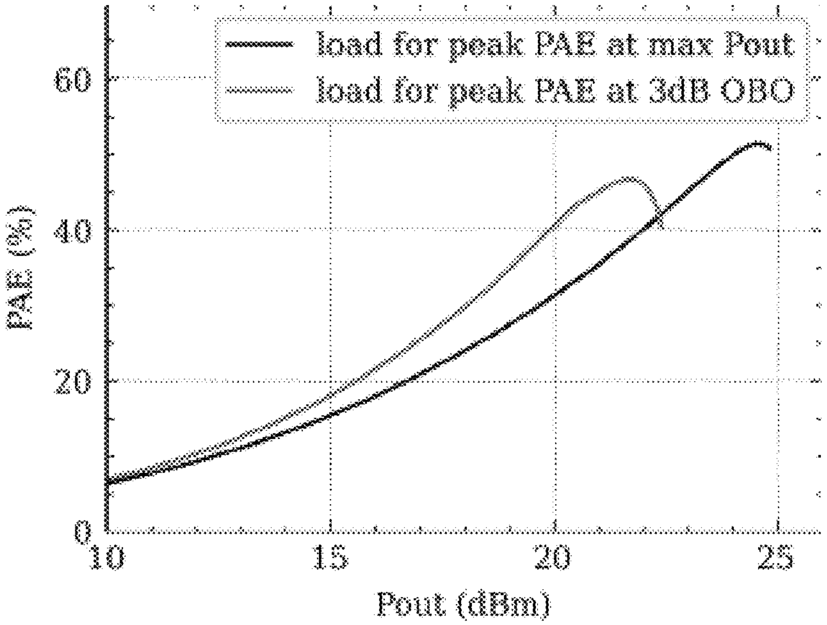

To understand the viability of POLM applied to a millimeter-wave PA, we consider two candidate circuit technologies: 45-nm CMOS SOI and 150-nm GaN HEMTs. For the CMOS SOI, we consider a 4-stack FET PA approach at 28 GHz to achieve the peak output power of 24.5 dBm. In FIGS. 9A and 9B, we plot the power added efficiency (PAE) curves to determine the peak PAE at maximum power and 3-dB OBO (out power back-off) from the loadpull simulation. The peak power demonstrates more than 24 dBm with an efficiency of 51%. At 3-dB OBO, the efficiency is 46.7% and at 6-dB OBO it is about 32%. The load impedance trajectory between these power levels requires reactive load variation that is illustrated in the Smith chart of FIG. 9A. The larger curve indicates a specific implementation of the asymmetric load modulation with constant total loop length as discussed previously. The following table applies to FIGS. 9A and 9B.

| Pin (dBm) | $Z_L$ (Ω) | PAE (%) | Pout (dBm) |
|---|---|---|---|
| 8 | 43 + j90 | 46.7 | 21.7 |
| 13 | 41 + j38 | 51.4 | 24.5 |

Figure 10A:
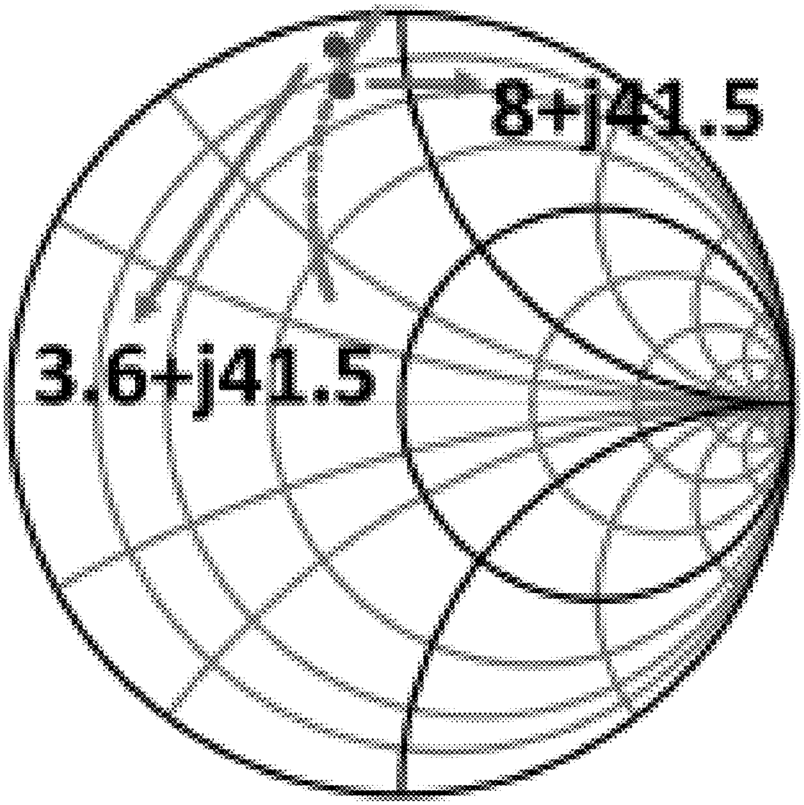
FIGS. 10A and 10B are a Smith Chart and plot of Load modulation for GaN HEMT single device illustrating the load impedance variation.
Figure 10B:
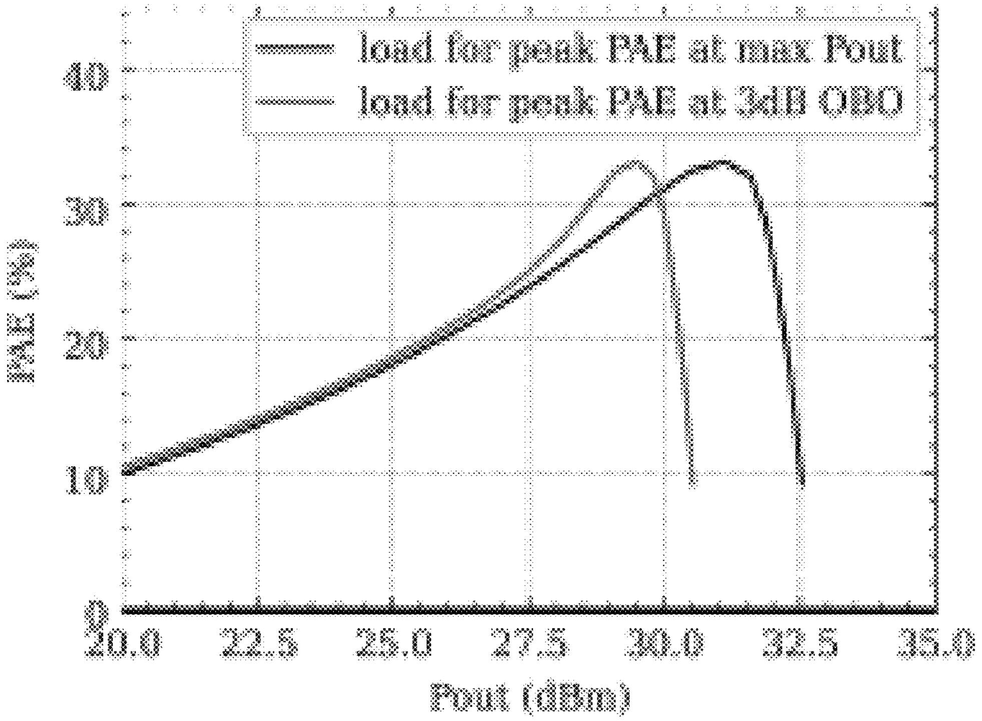

A 150-nm GaN HEMT technology targets an output power of 31.5 dBm using a single common source transistor in FIGS. 10A and 10B. Whereas the reactive load in the SOI CMOS PA changes significantly, the reactive part of the desired load impedance of the GaN HEMT does not change under the OBO power condition. Therefore, the GaN HEMT is attractive for symmetric load modulation with a resistive loadline variation. The following table applies to FIGS. 11A and 11B.

| Pin (dBm) | $Z_L$ (Ω) | PAE (%) | Pout (dBm) |
|---|---|---|---|
| 24 | 3.6 + j41.5 | 33.7 | 28 |
| 26 | 8 + j41.5 | 34.5 | 31.5 |

Figure 11A:
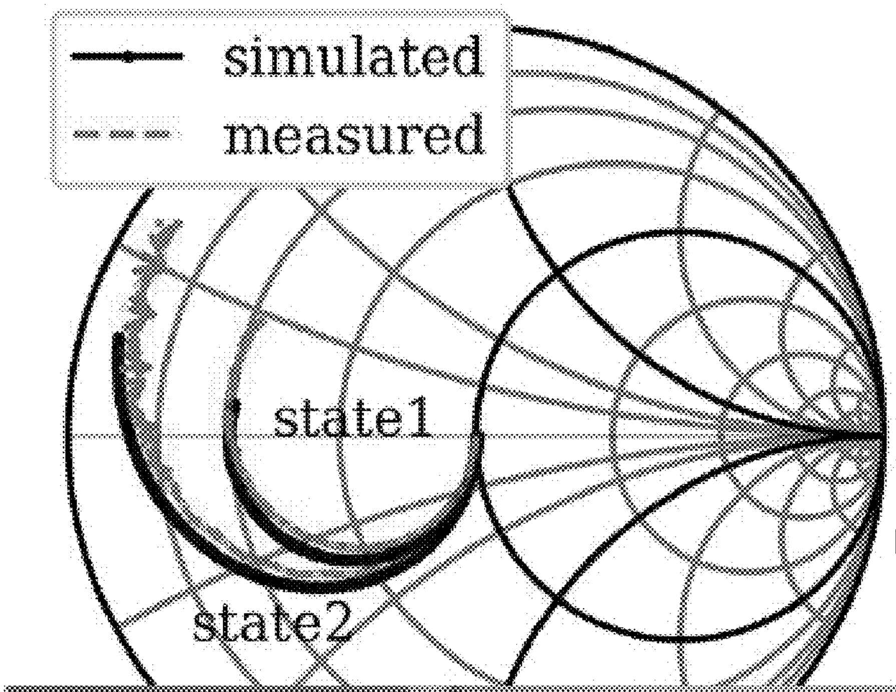
FIGS. 11A and 11B are a Smith Chart and micrograph of a GaN POLM comparison of simulation and measured input reflection for the 2 states from 10 MHz to 30 GHz.
Figure 11B:
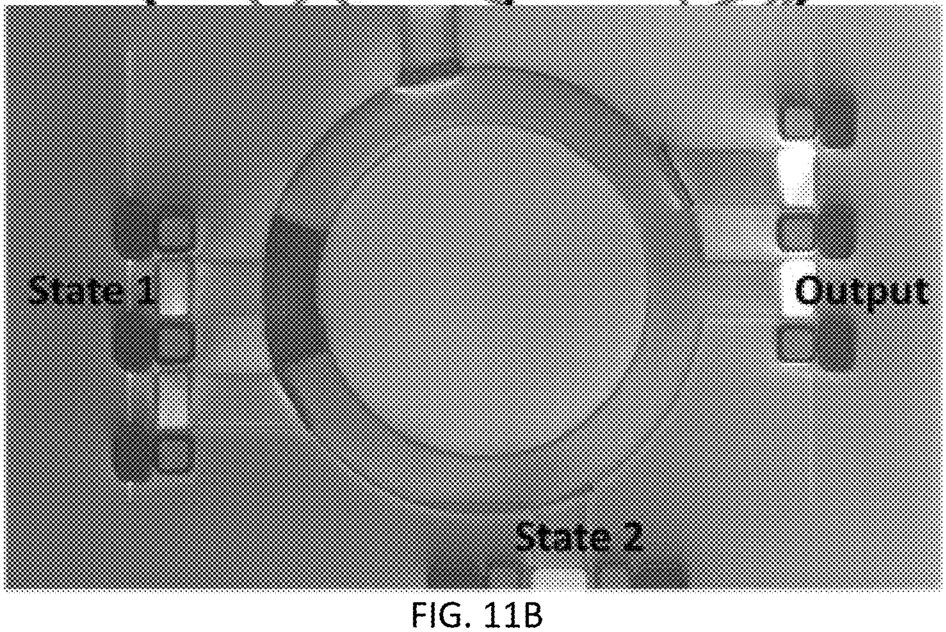

Since the POLM can be external to the chip and realized as a separate component between the PA and the antenna, we consider the implementation of the POLM on a GaN substrate to determine the losses of the ring at 28 GHz. A test structure is illustrated in FIG. 11B to measure the losses of the POLM with two different differential states shown in FIG. 11A. The ring has been designed with Σ=90°, where state 1 corresponds to Δ=0° and state 2 corresponds to Δ=56°. FIG. 11A shows the measurements of the two states. As predicted, the input impedance at the two different states corresponds with ZIN of 12.3+j8 in state 1 and 3+j11 in state 2 at 28 GHz. The insertion loss of the POLM is 0.15 dB in state 1 and 0.4 dB in state 2. Higher insertion losses may result if switches are required to connect to the ring along different outphasing arcs.

Figure 12:
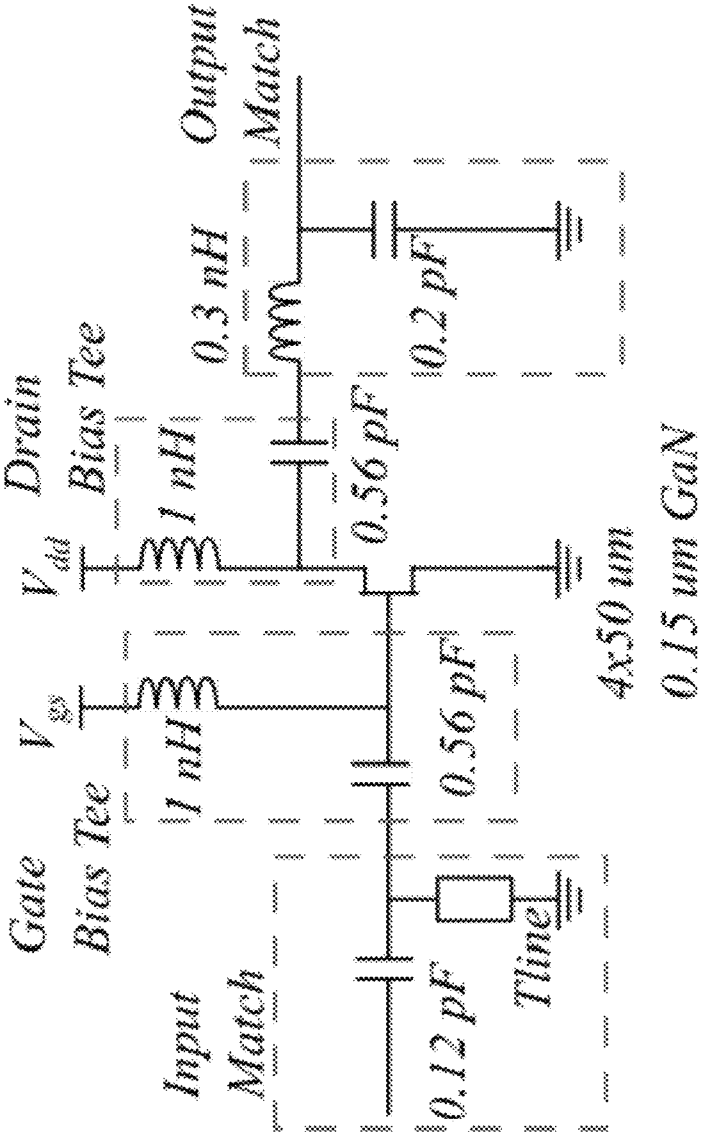
FIG. 12 is a schematic circuit diagram of a 28-GHz, class-AB GaN PA.
Figure 13A:
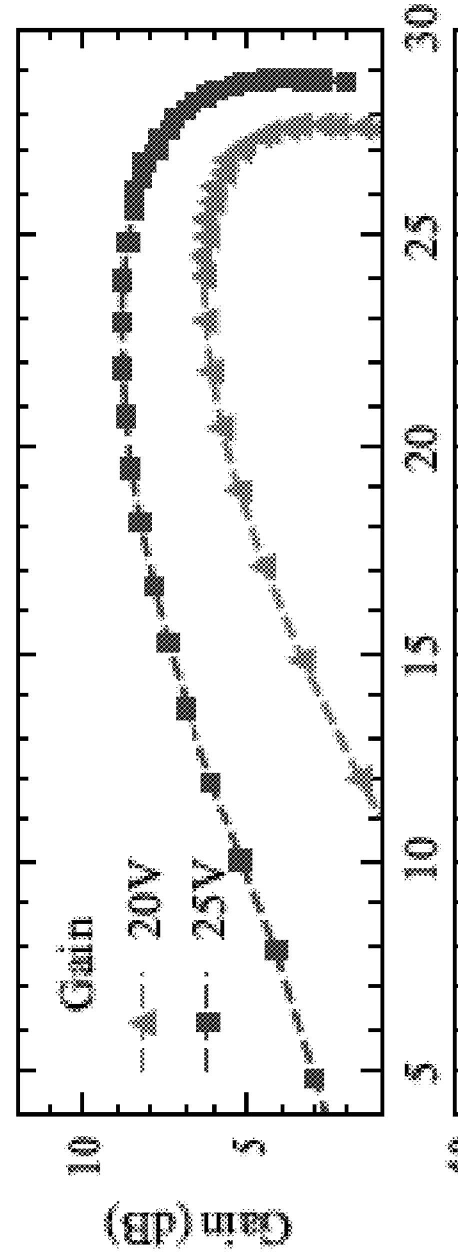
FIGS. 13A and 13B are a comparison of Gain and PAE for Vds=20V and Vds=25V (class B)
Figure 13B:
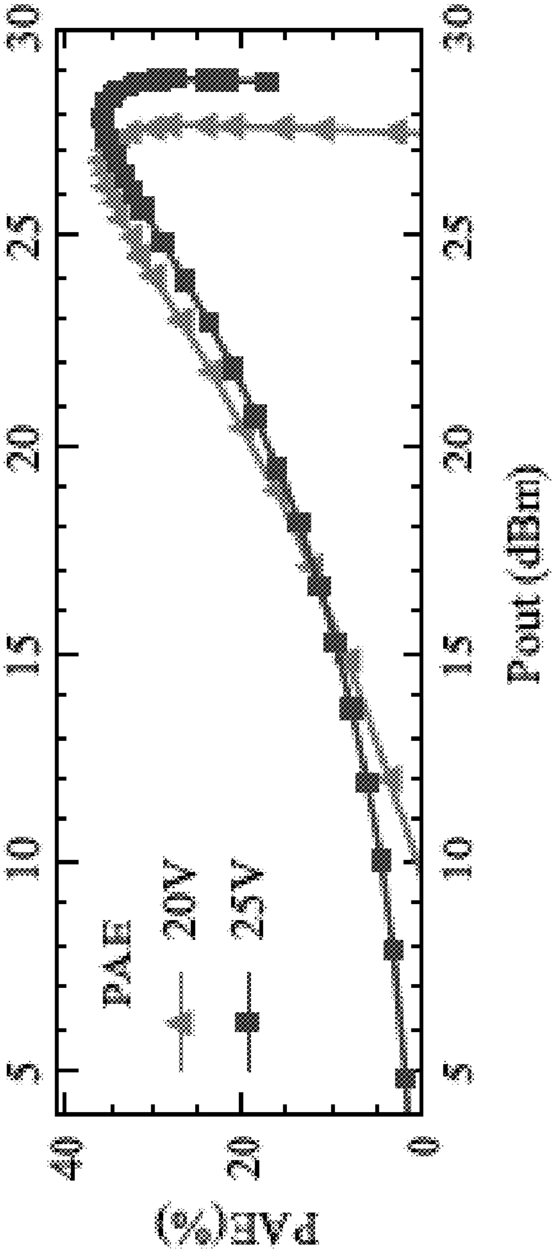

The schematic of a 0.15 um GaN, 28 GHz PA is shown in FIG. 12 and is capable of watt-level output power with high efficiency. The measured large-signal performance of the class-B GaN PA is illustrated in FIGS. 13A and 13B for different drain voltages. While the drain efficiency reaches 46% at an output power of 27 dBm, the class-B operation was measured under 20-V and 25-V drain supply conditions. The measured gain and PAE are plotted in FIGS. 13A and 13B. The peak gain is 6 dB for a 25-dBm output power under the 20-V supply. At peak power, the supply can be increased to 25 V to improve the gain by 2 dB and extend the output power to more than 28 dBm at the same efficiency. Hence, the supply voltage can be varied to achieve peak PAE at OBO power conditions.

Figure 14:
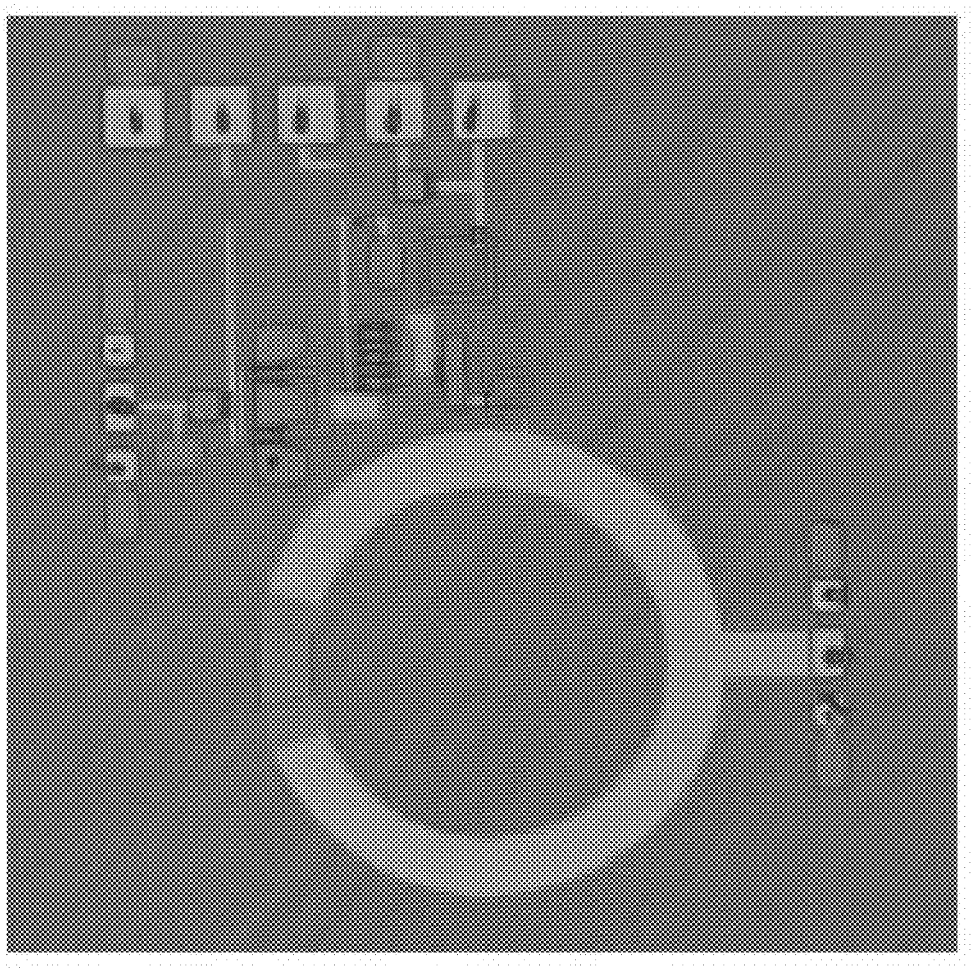
FIG. 14 is a micrograph of a GaN PA core with POLM.
Figure 15:
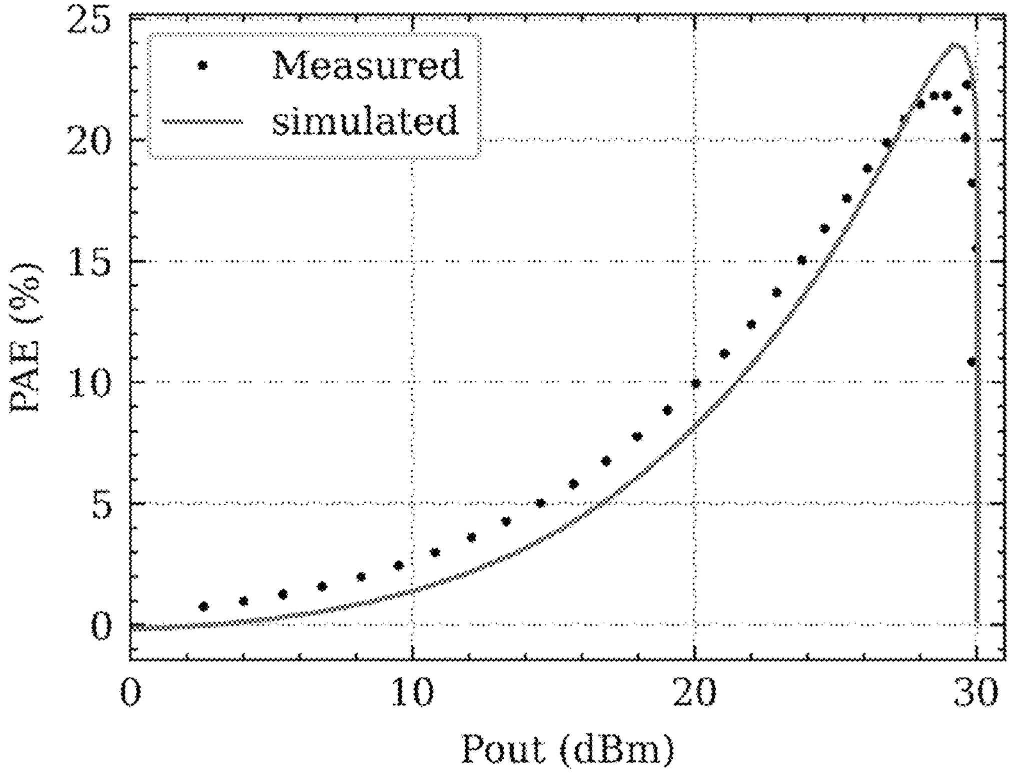
FIG. 15 is a plot of estimated and measured PAE of the GaN PA as a function of the output power.

FIG. 14 shows the layout of the GaN PA core along with POLM on a common substrate. Here, we replace the traditional matching network with the passive ring structure. A cascode topology is introduced to achieve increase the maximum output power (greater than 30 dBm) and PAE of around 24%. The point of the FIG. 14 implementation was to test how the network behaves under ideal conditions with a single connection point to the ring. In FIG. 15 the PAE is plotted as a function the output power (Pout). We find excellent agreement between simulation and measurement. At OBO of 10 dB, the PAE drops by a factor of ½ to 10%.

These experiments showed passive outphasing load modulation for reconfiguration of a millimeter-wave PA to achieve high average efficiency and tunable matching impedance. We present symmetric and asymmetric load networks and discussed the application to CMOS SOI and GaN device technologies. The prototype GaN POLM showed matching impedance variation from 3 to 12 Ohms with insertion loss from 0.15 to 0.4 dB. The complete PA design with the POLM integrated showed a PAE of 24% at 30 dBm of output power.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A passive, tunable on-chip load modulation network for a high-efficiency power amplifier, comprising:

a ring transmission line;

an output connected to a first point on the ring transmission line;

a first switched input connected to a second point on the ring transmission line, the second point being located on the ring transmission line to provide a first impedance transformation, the second point being located a first distance around the ring transmission line from the first point; and a second switched input connected to a third point on the ring transmission line, the third point being located on the ring transmission line to provide a second impedance transformation that is unique from the first impedance transformation, wherein the third point is located a second distance around the ring transmission line from the first point and the second distance is different than the first distance.

2. The passive, tunable on-chip load modulation network of claim 1, comprising a third switched input connected to a fourth point on the ring transmission line, the fourth point being located on the ring transmission line to provide a third impedance transformation that is unique from the first and second impedance transformations, wherein the fourth point is located at a third distance around the ring transmission line from the first point and the third distance is different than the first and second distances.

3. The passive, tunable on-chip load modulation network of claim 2, comprising one or more additional switched inputs connected to one or more respective additional points on the ring, each of the respective additional points establishing a unique impedance transformation and each being located at a unique distance around the ring transmission line from the first point and other ones of the second point. the third point, the fourth point and the one or more respective additional points.

4. The passive, tunable on-chip load modulation network of claim 1, comprising an RF input to the first and second switched inputs, wherein the RF input comprises a ground-signal-ground connection.

5. The passive, tunable on-chip load modulation network of claim 1, wherein the output comprises ground-signal-ground connection.

6. The passive, tunable on-chip load modulation network of claim 1, fabricated in GaN.

7. The passive, tunable on-chip load modulation network of claim 1, fabricated in silicon-on-insulator.

8. The passive, tunable on-chip load modulation network of claim 1, wherein the ring transmission line comprises a 360-degree trace with plurality of bulb shaped portions and straight valley portions.

9. The passive, tunable on-chip load modulation network of claim 1, wherein the ring transmission line has a width of a few microns.

10. The passive, tunable on-chip load modulation network of claim 1, wherein the ring transmission line has a characteristic impedance of 50-Ohms.

11. The passive, tunable on-chip load modulation network of claim 1, wherein the first distance around the ring transmission line is a distance that locates the second point a symmetrical distance to the first point in both directions around the ring transmission line.

12. The passive, tunable on-chip load modulation network of claim 1, wherein the first switched input and the second switched input are connected to an input port through a passively switched input network.

13. The passive, tunable on-chip load modulation network of claim 1, wherein the first switched input, the second switched input and the third switched input are connected to an input port through a passively switched input network.

14. The passive, tunable on-chip load modulation network of claim 1, wherein the first switched input, the second switched input, the third switched input and the one or more additional switched inputs are connected to an input port through a passively switched input network.

* * * * *